(12) United States Patent
Ducros et al.

(10) Patent No.: US 8,288,196 B2
(45) Date of Patent: Oct. 16, 2012

(54) PROCESS FOR FABRICATING A SILICON-BASED THIN-FILM PHOTOVOLTAIC CELL

(75) Inventors: Cedric Ducros, Bevenais (FR); Frederic Sanchette, Montferrat (FR); Christophe Secouard, L'Isle Adam (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 12/989,311

(22) PCT Filed: Apr. 20, 2009

(86) PCT No.: PCT/FR2009/000461
§ 371 (c)(1),
(2), (4) Date: Apr. 4, 2011

(87) PCT Pub. No.: WO2009/133315
PCT Pub. Date: Nov. 5, 2009

(65) Prior Publication Data
US 2011/0223711 A1    Sep. 15, 2011

(30) Foreign Application Priority Data

Apr. 23, 2008 (FR) .................................. 08 02270

(51) Int. Cl.
*H01L 21/00* (2006.01)
*H01L 21/36* (2006.01)

(52) U.S. Cl. ............ 438/96; 438/97; 438/486; 438/487; 257/E31.011

(58) Field of Classification Search .................... 438/96, 438/97, 486, 487; 257/E31.011
See application file for complete search history.

(56) References Cited

U.S. PATENT DOCUMENTS

| | | | | |
|---|---|---|---|---|
| 5,063,173 A | * | 11/1991 | Gasser et al. | 438/38 |
| 5,384,481 A | * | 1/1995 | Holzworth et al. | 257/530 |
| 5,994,164 A | * | 11/1999 | Fonash et al. | 438/97 |
| 6,677,618 B1 | * | 1/2004 | Horie et al. | 257/94 |
| 7,592,198 B2 | * | 9/2009 | Huet et al. | 438/72 |
| 2008/0092951 A1 | * | 4/2008 | Wang et al. | 136/258 |
| 2008/0265255 A1 | * | 10/2008 | Goyal | 257/64 |

FOREIGN PATENT DOCUMENTS

WO     2006 100403        9/2006
WO     WO 2006100403 A1 *  9/2006

OTHER PUBLICATIONS

International Search Report issued Sep. 30, 2010 in PCT/FR09/000461 filed Apr. 20, 2009.

* cited by examiner

*Primary Examiner* — Kevin Parendo
(74) *Attorney, Agent, or Firm* — Oblon, Spivak, McClelland, Maier & Neustadt, L.L.P.

(57) ABSTRACT

A process for fabricating a silicon-based thin-film photovoltaic cell, applicable for example in the energy generation field. The fabrication process includes a) depositing a p-doped or n-doped amorphous silicon film, the X-ray diffraction spectrum of which has a line centered at 28° that has a mid-height width, denoted by a, such that $4.7° \leq a < 6.0°$, on a substrate.

14 Claims, 4 Drawing Sheets

PROCESS FOR FABRICATING A SILICON-BASED THIN-FILM PHOTOVOLTAIC CELL

Figure 1:
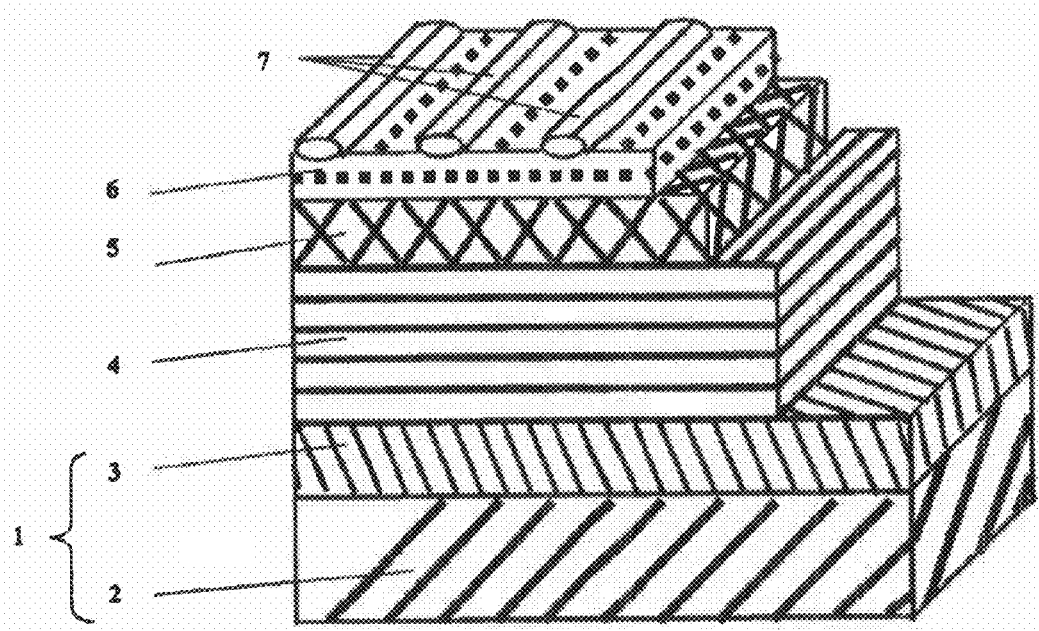

The invention relates to a process for fabricating a silicon-based thin-film photovoltaic cell.

It also relates to a device for implementing this process.

Photovoltaic cells at the present time mostly consist of solid mono- or poly-crystalline silicon modules.

Despite a high conversion efficiency of approximately 20%, the present cost of these modules made of solid mono- or poly-crystalline silicon is still too high for them to be competitive with electricity supplied by the mains.

This is why some of the research is focused on semiconductor-based thin-film cells.

In practice, the thin-film technology makes it possible to reduce the quantity of semiconductors used and also makes it possible to use inexpensive and large surface-area substrates.

In the thin-film photovoltaic cells, the silicon can be amorphous silicon or crystalline silicon, usually polycrystalline.

However, the photovoltaic cells based on thin films of amorphous silicon are subject to problems of stability when they are exposed to the sun. Furthermore, because of its disorderly structure, the charge transport properties of the amorphous silicon are mediocre, hence a mediocre efficiency.

Thus, a drop in efficiency of 10 to 50% in these cells occurs during the first hundred or so hours of exposure to light of the cells based on amorphous silicon.

Furthermore, the efficiencies of the market-standard modules based on thin films of amorphous silicon are stuck at around 10% despite several decades of research devoted to improving their conversion rate. Currently, the maximum conversion efficiency of such cells is situated within the 9 to 10% range, as indicated, for example, by K. MEIER et al in *Potential of amorphous and microcrystalline silicon solar cells*, Thin Solid Films, 451-452 (2004), pp 518-524.

In this document, the silicon depositions are performed by plasma-enhanced chemical vapor deposition (PECVD) at rates of 0.3 to 1 micrometer/h.

As for them, the photovoltaic cells based on thin-film crystalline silicon represent a trade-off between the excellent electronic properties of the solid monocrystalline silicon and the material cost-effectiveness of the amorphous silicon.

However, a polycrystalline silicon film can be obtained directly only at a temperature above 800° C., which imposes the use of costly substrates with high thermal resistance, such as monocrystalline silicon or ceramics.

In practice, the use of low-cost substrates, such as metals or glass, entails not exceeding a temperature of 600° C. maximum during the various steps implemented to create such cells.

As it happens, at these temperatures, the silicon obtained is amorphous. It is therefore essential to have recourse to an additional step for crystallization of the deposited amorphous silicon, after the step for deposition of this amorphous silicon.

There are industrial processes for fabricating photovoltaic cells based on thin-film polycrystalline silicon in which the amorphous silicon is crystallized by thermal baking (solid phase crystallization), but the silicon depositions are performed in a PECVD chamber and the baking is performed in a different item of equipment.

Such a process is described in GREEN et al. *Crystalline silicon on glass (CSG) thin-film solar cell modules*, Solar Energy 77, (2004), pp 857-863.

A conversion efficiency of 10.4% is obtained with the photovoltaic cells based on thin-film polycrystalline silicon fabricated by this process.

Also known is the electron beam physical vapor deposition (EBPVD) process, used in the mechanical and aeronautical industries.

This process makes it possible to perform different depositions and heat treatments in line and in a vacuum in a single electron beam physical vapor deposition chamber.

Thus, the document WO 2004/033769 describes a process for forming crystalline semiconductor films on foreign substrates, in which the amorphous semiconductor film is formed by using such a process.

The semiconductor material may be silicon, germanium or a mixture of silicon and germanium.

The amorphous semiconductor film is deposited at a substrate temperature within the 20 to 650° C. range, preferably at a temperature of 20 to 400° C. and, more preferably, at a temperature of 150° C. and at a pressure within the 0.2 to $1 \times 10^{-7}$ Torr range.

Then, this amorphous semiconductor film is crystallized by solid phase epitaxial crystallization at a temperature within the 0 to 650° C. range for a period of up to 7 days, preferably at a temperature of 540° C.±5° C. for a period of 17±0.1 hours.

However, when this document describes the formation of an amorphous silicon film which must then be crystallized, it indicates that the amorphous silicon film is formed at approximately 150° C. in a single time and does so at a deposition rate of approximately 250 nm/minute and it also teaches that the subsequent solid phase epitaxial crystallization step is performed at a temperature of 540° C. at a pressure of 5 to $1 \times 10^{-6}$ Torr and that the crystallization is obtained in 17 hours, starting from the underlying crystallized silicon seeding film using the aluminum-induced crystallization method.

In contrast, the invention relies on the discovery that the crystallization time for an amorphous silicon film deposited by EBPVD can be greatly reduced to approximately 400 minutes when the inverse of the mean distance order of the deposited amorphous silicon is between 4.7° and 6.0°; 4.7° being included and 6.0° being excluded.

The notion of mean distance order is a term used to describe the structural organization of amorphous systems on a scale larger than the distance between first or second nearest neighbors (short distance order) up to a limit greater than a few nanometers.

This mean distance order is determined by X-ray diffraction by measuring the mid-height width of the main spike of the X-ray diffraction spectrum of the silicon of the invention obtained in the following conditions: Line $K_\alpha$ of copper, tube emission parameters: 40 kV, 30 mA, counting time: 15 sec/step, increment: 0.05°/step, sweep between 20 and 60°.

Figure 8:
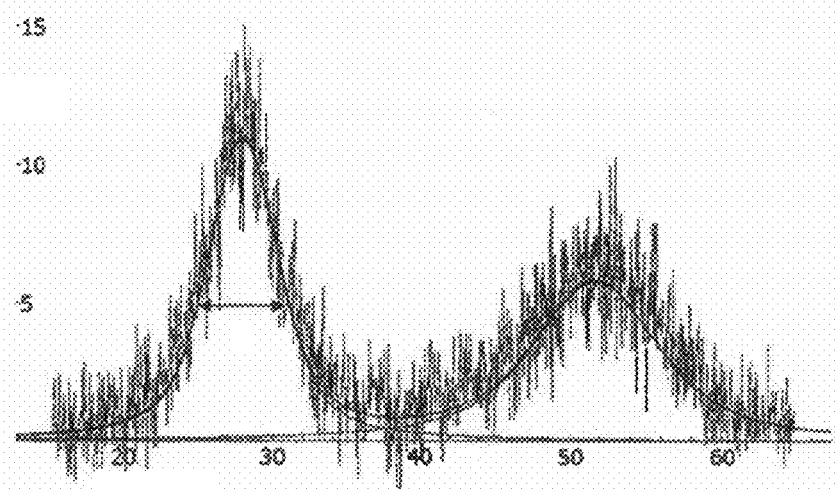

FIG. 8 shows the X-ray diffraction spectrum obtained on the amorphous silicon used in the invention and indicates the mid-height width, denoted a, of the main spike of this silicon.

The mean distance order is defined as being the inverse of this mid-height width, that is to say 1/a.

Thus, the invention relates to a process for fabricating a photovoltaic cell, characterized in that it comprises a step a) for deposition of a p-doped or n-doped amorphous silicon film, the X-ray diffraction spectrum of which has a line centered at approximately 28°, more specifically between 27.9° and 28.1°) having a mid-height width, denoted a, such that $4.7° \leq a < 6.0°$ on a substrate.

According to one advantageous implementation of said process, the mid-height width a is such that $4.7° \leq a \leq 5.7°$.

According to another advantageous implementation of said process, the mid-height width a is such that $a = 5.44°$.

According to yet another advantageous implementation of said process, the step a) is a step for deposition of an amorphous silicon film by electron beam physical vapor deposition (EBPVD) on the substrate (1) heated to a temperature T such that 405° C.±5° C.<T≦475° C.±5° C. at a pressure P of between $1.10^{-7}$ mbar and $1.10^{-4}$ mbar.

According to another advantageous implementation of said process, the step a) is a step for deposition of an amorphous silicon film by electron beam physical vapor deposition (EBPVD) on the substrate (1) heated to a temperature T such that 425° C.±5° C.≦T≦475° C.±5° C. at a pressure P of between $1.10^{-7}$ mbar and $1.10^{-4}$ mbar.

According to an advantageous arrangement of the latter implementation, the step a) is a step for deposition of an amorphous silicon film by electron beam physical vapor deposition (EBPVD) on the substrate (1) heated to a temperature T=425° C.±5° C. at a pressure of $6\times10^{-6}\pm5.10^{-7}$ millibars.

According to another advantageous implementation of said process, the step a) is a step for deposition of an amorphous silicon film by electron beam physical vapor deposition (EBPVD) on the substrate (1) at a deposition rate v of between 0.5 and 4 nm/s inclusive.

According to yet another advantageous implementation of said process, the step a) is a step for deposition of an amorphous silicon film by electron beam physical vapor deposition (EBPVD) on the substrate (1) at a deposition rate v of between 0.5 and 2 nm/s inclusive.

Another subject of the present invention is a process for fabricating a photovoltaic cell, characterized in that the step a) is a step for deposition at a rate of 2 nm/s, denoted v, of an amorphous silicon film by electron beam physical vapor deposition (EBPVD) on a substrate.

According to an advantageous implementation of said fabrication process, the latter comprises, in addition, a step b) for crystallization of the silicon forming the thin film obtained in the step a) by baking at a temperature of between 550° C.±5° C. and 650° C.±5° C. inclusive.

According to another advantageous implementation of said fabrication process, it comprises, in addition, a step b) for crystallization of the silicon forming the thin film obtained in the step a) by baking at a temperature of between 550° C.±5° C. and 650° C.±5° C. inclusive, for a duration of between 400 minutes and 48 hours inclusive.

According to yet another advantageous implementation of said fabrication process, it comprises, in addition, a step b) for crystallization of the silicon forming the thin film obtained in the step a) by baking at a temperature of 600° C.±5° C. for a duration of between 400 minutes and 1000 minutes.

According to another advantageous implementation of said fabrication process, the latter comprises, in addition, a step b) for crystallization of the silicon forming the thin film obtained in the step a) by baking at a temperature of 600° C.±5° C. for a period of 530 minutes±10 minutes.

According to another advantageous implementation of said fabrication process, the latter comprises, in addition, a step c) for deposition of an amorphous silicon film on the film of crystalline silicon obtained in the step b).

According to yet another advantageous implementation of said fabrication process, the latter comprises, in addition, a step d) for deposition of a film of a transparent conductive oxide on the amorphous silicon film obtained in the step c).

According to yet another advantageous implementation of said fabrication process, the latter comprises, in addition, a step e) for deposition of metallic contacts on the transparent conductive oxide film obtained in the step d).

According to another advantageous implementation of said fabrication process, the substrate is made of a support, advantageously of borosilicate or of metal, coated with a film of SiN or TiN, preferably SiN, obtained by SiN or TiN deposition, by EBPVD, on said support.

The invention aims to resolve the problems of the known processes for fabricating photovoltaic cells based on thin crystalline silicon films.

Figure 2:
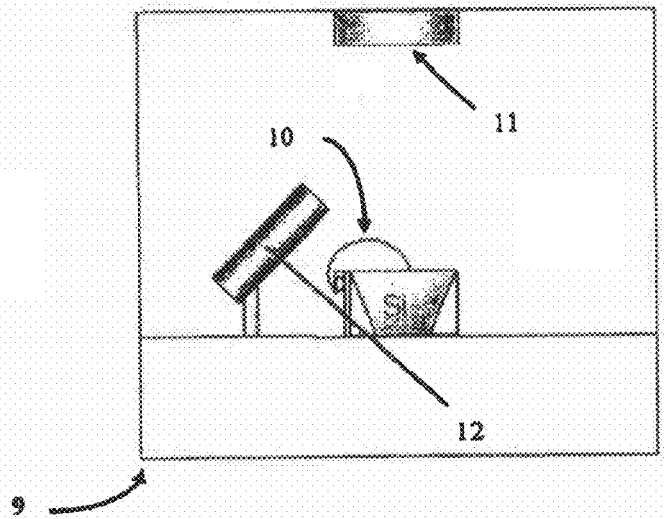
Figure 3:
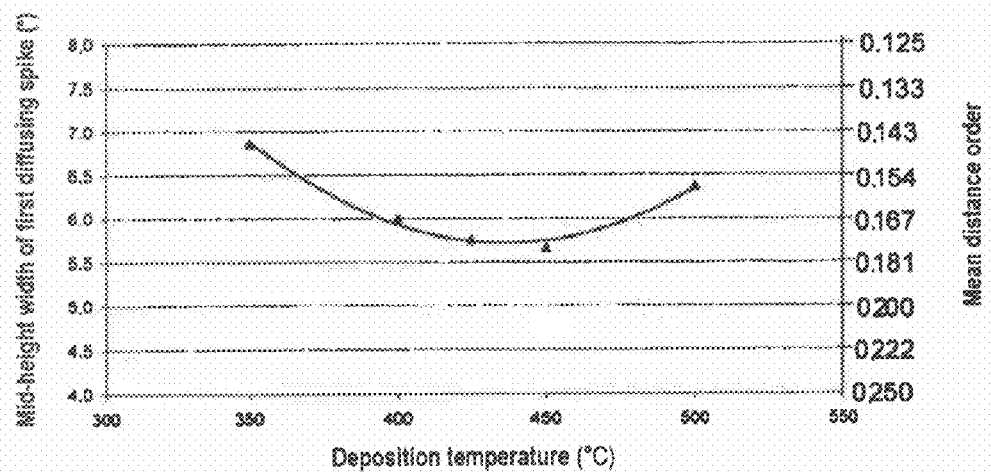
Figure 4:
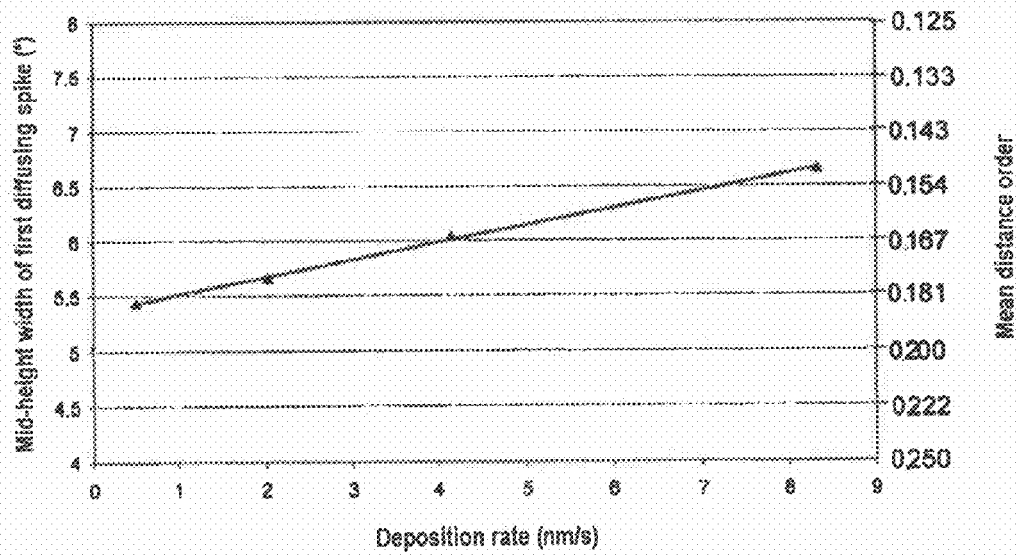
Figure 5:
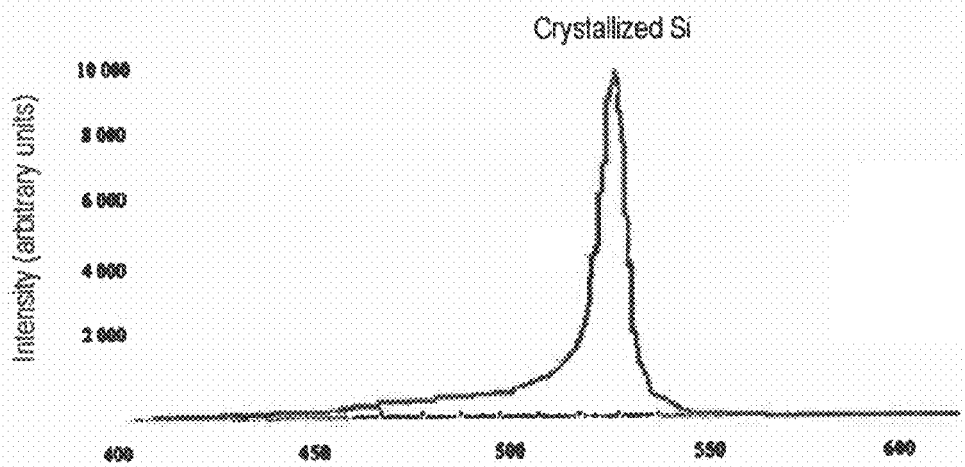
Figure 6:
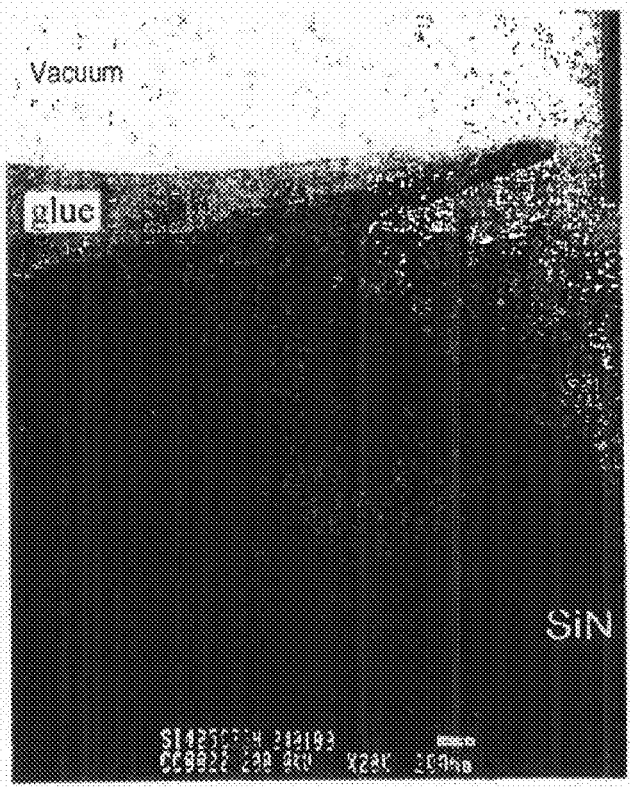
Figure 7:
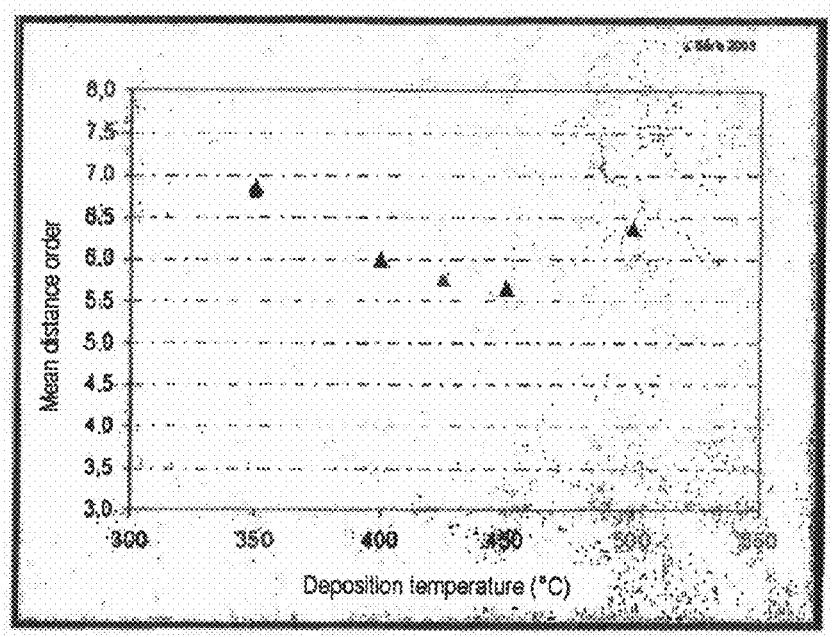

The invention will be better understood, and other advantages and features of it will become more clearly apparent from reading the following explanatory description and which is given with reference to the figures in which:

FIG. 1 represents a cross-sectional scheme of a photovoltaic cell based on crystalline silicon in thin films, FIG. 2 schematically represents a device for implementing the process of the invention, FIG. 3 is a curve showing the crystallization time at a temperature of 600° C.±5° C. of the amorphous silicon film formed in the process of the invention, according to the mean distance order, FIG. 4 represents the variation of the mean distance order of the amorphous silicon as a function of the deposition rate of this amorphous silicon, FIG. 5 shows the Raman spectrum of the crystalline silicon film obtained by the process of the invention, and FIG. 6 is a photograph taken with a transmission electron microscope of the crystalline silicon film obtained by the process of the invention, FIG. 7 shows the variation of the mean distance order of the amorphous silicon deposited as a function of the deposition temperature, FIG. 8 represents an example of X-diffraction spectrum obtained with the amorphous silicon used in the invention and defining the mid-height width, denoted a, that is to say, the mean distance order of this amorphous silicon, this mean distance order being inversely proportional to this mid-height width, denoted a in this figure.

A photovoltaic cell based on thin films of crystallized silicon is represented in FIG. 1.

As can be seen in FIG. 1, such a photovoltaic cell is made of a stack of films deposited on a substrate, denoted 1 in FIG. 1.

As can be seen in FIG. 1, this substrate is made of the support itself, denoted 2 in FIG. 1, generally covered with a film, denoted 3 in FIG. 1, of silicon nitride, SiN.

The film 3 of silicon nitride serves as a barrier film to the diffusion of the impurities originating from the support 2.

The film 3 may also be made of titanium nitride or any other material having the desired barrier properties. This film 3 is optional.

Thus, in the preceding and following text, the term substrate, possibly followed by the digit 1, denotes the support made of an inexpensive material, such as borosilicate or metal, coated with the film 3.

Generally, the thickness of the support 2 is 0.5 to 1 mm, and the thickness of the film 3 of silicon nitride is approximately 1 micrometer.

This substrate 1 then has deposited on it a film, denoted 4 in FIG. 1, of p-doped or n-doped crystalline silicon, with a thickness of between 2 and 10 micrometers inclusive. This film 4 is the absorber, that is to say, the film within which the incident photons are absorbed and converted into electron-hole pairs.

Then, the film 4 of crystalline silicon has deposited on it a film, denoted 5 in FIG. 1, of n- or p-doped hydrogenated amorphous silicon, with a thickness of approximately 10 nanometers.

This film 5 is used to form the heterojunction with the p or n film of crystalline silicon 4. It is used to separate the electrons and the holes.

The film 5 of hydrogenated amorphous silicon is made of p-doped silicon when the film 4 of crystalline silicon is itself made of n-doped silicon. Conversely, the film is made of n-doped hydrogenated amorphous silicon when the film 4 is made of p-doped crystalline silicon.

This film 5 has deposited on it a film, denoted 6 in FIG. 1, made of a transparent conductive oxide (TCO). This film acts as a transparent electrode. It is used to adapt the resistivity between the n- or p-doped hydrogenated amorphous silicon and the metallic contacts of the photovoltaic cell. This film of transparent conductive oxide generally has a thickness of between 50 and 100 nanometers inclusive. For the transparent conductive oxide used, it is possible to cite zinc oxide, indium oxide or even tin oxide.

Finally, the metallic contacts are deposited on the film 6 of transparent conductive oxide. These metallic contacts, denoted 7 in FIG. 1, are used to collect the electrons on the one hand and the holes on the other hand, separated by the pn heterojunction.

The process of the invention, which uses the EBPVD deposition technique makes it possible to obtain, in line and in a vacuum, various films needed to fabricate polycrystalline silicon-based thin-film photovoltaic cells, that is to say, on the one hand, the passive films (nitrided barrier, transparent conductive oxide and metallic contacts) and, on the other hand, the amorphous silicon films whose properties can be adjusted during growth, either so as to optimize the subsequent crystallization step for the formation of the polycrystalline absorber, or in order to hydrogenate the amorphous emitter, and do so without changing the apparatus, which makes it possible to avoid any pollution due to a change of heat treatment apparatus.

In practice, in the invention, the p-doped or n-doped crystalline silicon film is obtained by deposition of a p-doped or n-doped amorphous silicon film, the X-ray diffraction spectrum of which has a line centered at approximately 28° (in practice, between 27.9° and 28.1° having a mid-height width, denoted a, and such as represented in FIG. 8, such that $4.7° \leq a \leq 6.0°$, then by crystallization of this silicon, still in the same chamber.

This makes it possible to deposit at rates at least ten times higher than those achieved in the processes traditionally used in microelectronics, and without the use of toxic gas.

In practice, the cells based on thin films of polycrystalline silicon having high conversion efficiencies are currently produced by silicon deposition by PECVD at rates of between 0.3 and 1 micrometer per hour. The rate achieved with the EBPVD process is at least 15 micrometers per hour.

Thus, the process of the invention relies on the discovery that there is an optimum mean distance order for the p- or n-doped amorphous silicon film formed which is then to be crystallized.

In practice, it has been discovered that, when the amorphous silicon film, which will then, after crystallization, form the film denoted 4 in FIG. 1, has a mean distance order such that $4.7° \leq a \leq 6.0°$, the duration of the process for crystallizing the silicon forming this film is between 400 minutes and 48 hours.

The upper limit of 48 hours is defined as the maximum that can be envisaged in an industrial process.

The lower limit of 400 minutes is the limit obtained with a mean distance order 1/a in which a=4.7°.

Thus, preferably, in the process of the invention, a p-doped or n-doped amorphous silicon film will be deposited with the mean distance order 1/a such that $4.7° \leq a \leq 5.7°$, in which case the crystallization time for this silicon film is between 400 minutes and 1000 minutes.

Preferably, a p-doped or n-doped amorphous silicon film will be deposited with the mean distance order 1/a equal to 1/5.44°.

With such an amorphous silicon film, the crystallization time for this film at a temperature of 600° C. is less than 9 hours, more specifically 8.9 hours.

For an amorphous silicon film having a mean distance order 1/a with a=5.7°, as shown in FIG. 3 which shows the trend of the crystallization time as a function of the mean distance order, the crystallization time is reduced to 600 minutes.

Such an amorphous silicon film having such a mean distance order can be obtained by any means.

Preferably, in the invention, the amorphous silicon film is advantageously obtained by silicon deposition by electron beam physical vapor deposition (EBPVD) on the substrate denoted 1 in FIG. 1, heated to a temperature T such that $405° C. \pm 5° C. < T \leq 460° C. \pm 5° C.$ at a pressure of between $1.10^{-7}$ mbar and $1.10^{-4}$ mbar, as can be seen in FIG. 7 which represents the variation of the mean distance order as a function of the temperature of the substrate during deposition by electron beam physical vapor deposition (EBPVD).

It can also be seen from FIG. 7 that, when the substrate is heated to a temperature of between 425° C.±5° C. and 475° C.±5° C. inclusive at a pressure of $6 \times 10^{-6}$ millibars, the amorphous silicon obtained has a mean distance order 1/a with a between 4.7° and 5.7° inclusive, which makes it possible to crystallize the amorphous silicon in less than 9 hours.

In a very preferred way, in order to minimize the energy costs, the deposition of the amorphous silicon film will be done at a substrate temperature of 425° C.±5° C. and at a pressure of $6 \times 10^{-6}$ millibars.

In these temperature ranges, the mean distance order 1/a can still be modulated by acting on the deposition rate of the amorphous silicon film.

Thus, as can be seen from FIG. 4 which represents the trend of the mean distance order as a function of the deposition rate at a temperature of 425° C. and at a pressure of $6 \times 10^{-6}$ millibars, the mean distance order of the amorphous silicon film deposited changes almost linearly with the deposition rate.

Thus, in the invention, to obtain a mean distance order, denoted 1/a, with a between 4.7° and 6.0°, while remaining less than 6.0°, the deposition rate is between 0.5 nm/s and 4 nm/s inclusive.

A deposition rate of less than 0.5 nm/s would result in a degradation of the quality of the amorphous silicon deposited favoring a possible contamination of the latter with carbon or oxygen.

At rates of deposition higher than 4 nm/s, the mean distance order 1/a is less than 1/6.0°.

The rates of deposition of 0.5 nm/s and 4 nm/s make it possible to create a deposition 2 μm thick in, respectively, 66 min 30 sec and 8 min 20 sec.

This reduction in the deposition rate is accompanied by an improvement in the mean distance order with a which changes from 5.99° to 5.44°, which corresponds to crystallization times for this amorphous silicon film of respectively 1000 minutes and 534 minutes.

Thus, a reduction in the deposition rate is accompanied by an increase of approximately 58 minutes in the deposition time but makes it possible to reduce the baking time by 650 minutes.

The duration of the crystallization step may be very much greater, with an upper limit of 48 hours, but this is not desirable from the industrial point of view and, above all, is not necessary in the invention.

Thus, preferably, the deposition rate is between 0.5 and 2 nm/s inclusive, because, as can be seen in FIG. 4, the mean distance order is then such that a is between 5.44° and 5.6°, which, as can be seen in FIG. 3, leads to crystallization times of less than 534 minutes.

Most preferably, in order not to increase the duration of the deposition, the deposition rate will preferably be 2 nm/s.

Thus, with the process of the invention, the crystallization time needed to crystallize the amorphous silicon film at a temperature of 600° C. is between 400 minutes and 48 hours, preferably between 400 minutes and 1000 minutes and most preferably 530 minutes±10 minutes.

Obviously, the process of the invention also comprises the conventional steps of any photovoltaic cell fabrication process, that is to say the deposition, on the p- or n-doped crystalline silicon film, of an n- or p-doped hydrogenated amorphous silicon film.

The process of the invention also comprises the deposition of a transparent conductive oxide film on the hydrogenated amorphous silicon film and the deposition of electrical contacts on this transparent conductive oxide film.

As for the substrate used, it may consist of any support made of an inexpensive material, optionally coated with a film of silicon nitride or of any other material having the desired barrier properties.

A device for implementing the process of the invention is represented in FIG. 2.

This device is constituted of a conventional chamber used for the EBPVD deposition but additionally comprising an ion gun and a substrate heating device.

As can be seen in FIG. 2, the EBPVD chamber, denoted in FIG. 2, comprises a high-speed electron beam physical vapor deposition module, denoted 10 in FIG. 2, and a sample-holder, denoted 11 in FIG. 2, which is used to position the substrate for the deposition of the various desired films. However, this device also comprises, to implement the process of the invention, an ion gun, denoted 12 in FIG. 2, and a heating device (not represented) for the substrate which will be positioned on the sample-holder 11.

The presence of an ion gun allows for the preparation of the surfaces before deposition (ion pickling), assistance during the growth of the films and the insertion of reactive gas such as a mixture of nitrogen and oxygen, for the deposition of nitride and oxide films. The substrate heating device makes it possible to obtain films, in particular of amorphous silicon, to be recrystallized, that have the desired properties.

These two elements make it possible to modify the properties of the amorphous silicon film during growth:
the mean distance order in the amorphous silicon films deposited by this technique corresponds to a locally well-ordered material, that is to say, one that is favorable for crystallization.

The quality of the amorphous silicon films deposited in this way can be estimated by Raman spectrometry, by calculating the mid-height width of the band TO (at 480 cm$^{-1}$).

The results of the measurements performed on the amorphous silicon films obtained by the process of the invention have revealed a mean width of 62 cm$^{-1}$ which corresponds to the values traditionally obtained by PECVD, that is to say, a width less than 80 cm$^{-1}$.

FIG. 4 represents a spectrum obtained by Raman spectrometry on an amorphous silicon film deposited using the process of the invention and then crystallized.

In order to better understand the invention, there now follows a description of several implementations.

EXAMPLE 1

In the process of the invention, all the depositions are performed by electron beam physical vapor deposition of the various materials.

Firstly, the support 2 is prepared. The support 2 is made of borosilicate or of metal. The latter is first of all chemically cleaned, using a mixture of acetone and alcohol and ultrasound. It is then deposited on the sample-holder, denoted 11 in FIG. 2.

The chamber 9 is then set to a secondary vacuum of approximately $6.10^{-6}$ mbar. Then the support 2 is pickled using the ion gun 12 (argon). The parameters for this pickling are as follows:

| | |
|---|---|
| Argon flow rate (sccm) | 4-20 |
| Emission current (mA) | 50-200 |
| Anode voltage (V) | 300-1200 |
| Acceleration voltage (V) | 25-150 |
| Duration (min) | 5-30 |

Then, a film 3 of silicon nitride, SiN, is deposited on the support 2. The parameters used during the deposition of this silicon nitride film are as follows:

| | |
|---|---|
| Nitrogen flow rate (sccm) | 4-20 |
| High voltage (kV) | 6-9 |
| Emission current (A) | 0.10-0.50 |
| Deposition rate (μm/h) | 1-6 |
| Thickness (μm) | 0.2-2 |

Then, p- or n-doped amorphous silicon film is deposited. This film, once the silicon has crystallized, will serve as an absorber, that is to say, as a film within which the incident photons are absorbed and converted into electron-hole pairs.

The parameters used are as follows:

| | |
|---|---|
| High voltage (kV) | 6-9 |
| Emission current (A) | 0.10-0.50 |
| Deposition rate (μm/h) | 1-20 |
| Thickness (μm) | 1-10 |

As for the substrate temperature, it was maintained at 350° C., 400° C., 425° C., 450° C. and 500° C. (five measurement points to construct the curve).

Then, the p- or n-doped silicon of this film was crystallized by heat treatment (solid phase crystallization) in situ, without being returned to the air, unlike the conventional processes. This step is carried out in a secondary vacuum, which makes it possible to avoid any contamination.

The crystallization temperature was chosen at between 550° C. and 650° C. and the duration of this crystallization was varied between 400 minutes and 48 hours.

Most favorably, when the substrate for the deposition of the amorphous silicon film is maintained at 425° C., the crystallization temperature for the amorphous silicon film was 600° C. for 8.9 hours.

The film 4 of crystalline silicon formed in this way was examined by transmission electron microscopy.

FIG. 5 is a photograph taken during this analysis.

As can be seen in FIG. 5, the size of the silicon grains is approximately 2 μm.

The crystalline silicon film obtained in this way has lifetimes of the intermediate minority carriers between those of the amorphous silicon and monocrystalline silicon films. This approach makes it possible to optimize the efficiencies for silicon-based thin-film cells.

Then, a film 5 of n-doped (or p-doped) hydrogenated amorphous silicon is deposited on the crystalline silicon film 4 formed in the preceding step.

The parameters used were as follows:

| | |
|---|---|
| High voltage (kV) | 6-9 |
| Emission current (A) | 0.10-0.50 |
| Deposition rate (μm/h) | 0.5-2 |
| Thickness (μm) | 0.005-0.050 |

Then, a film 6 of transparent conductive oxide (TCO), for example indium tin oxide (ITO) is deposited on the n- or p-doped hydrogenated amorphous silicon film obtained previously.

The parameters used are as follows:

| | |
|---|---|
| Oxygen flow rate (sccm) | 0-20 |
| High voltage (kV) | 6-9 |
| Emission current (A) | 0.10-0.60 |
| Deposition rate (μm/h) | 0.5-15 |
| Thickness (μm) | 0.05-0.5 |

FIG. 4 represents the Raman spectrum obtained in this step of the inventive photovoltaic cell fabrication procedure.

As can be seen in FIG. 4, the silicon of the film 4 is well crystallized: the mid-height width of the spike is of the order of 6 cm$^{-1}$, which corresponds to a well-crystallized state.

Finally, the metallic contacts 7 made of Ag are deposited on the transparent conductive oxide film.

The parameters for the deposition are as follows:

| | |
|---|---|
| High voltage (kV) | 8.00 |
| Emission current (A) | 0.20 |
| Deposition rate (μm/h) | 10 |
| Thickness (μm) | 0.08-1 |

A polycrystalline silicon-based thin-film photovoltaic cell was thus obtained.

The efficiency of this photovoltaic cell was 11%, a value higher than that obtained by the amorphous silicon cells of the prior art.

The invention claimed is:

1. A process for fabricating a photovoltaic cell, comprising:
a) depositing a p-doped or n-doped amorphous silicon film, an X-ray diffraction spectrum of which has a line centered at between 27.9° and 28.1° having a mid-height width, denoted a, such that 4.7°<a<6.0°, by electron beam physical vapor deposition (EBPVD) on a substrate heated to a temperature T such that 400° C.<T≦480° C. at a pressure P of between 1×10$^{-7}$ mbar and 1×10$^{-4}$ mbar inclusive and at a deposition rate of between 0.5 and 4 nm/s inclusive, and further comprising b) crystallizing the p-doped or n-doped amorphous silicon film by baking at a second temperature of between 545° C. and 655° C. inclusive.

2. The process as claimed in claim 1, wherein the mid-height width a is such that 4.7°<a<5.7°.

3. The process as claimed in claim 1, wherein the mid-height width a is such that a=5.44°.

4. The process as claimed in claim 1, wherein the depositing a) includes depositing said amorphous silicon film by electron beam physical vapor deposition (EBPVD) on the substrate heated to the temperature T such that 420° C.≦T≦480° C. at the pressure P of between 1×10$^{-7}$ mbar and 1×10$^{-4}$ mbar inclusive.

5. The process as claimed in claim 1, wherein the depositing a) includes depositing said amorphous silicon film by electron beam physical vapor deposition (EBPVD) on the substrate heated to the temperature T such that 420° C.≦T≦430° C. at the pressure P of between 59.5×10$^{-7}$ milibars and 65×10$^{-7}$ milibars.

6. The process as claimed in claim 1, wherein the depositing a) includes depositing said amorphous silicon film by electron beam physical vapor deposition (EBPVD) on the substrate at the deposition rate of between 0.5 and 2 nm/s inclusive.

7. The process as claimed in claim 1, wherein the depositing a) includes depositing said amorphous silicon film by electron beam physical vapor deposition (EBPVD) on the substrate performed at the deposition rate of 2 nm/s.

8. The process as claimed in claim 1, further comprising c) depositing an amorphous silicon film on the film of crystalline silicon obtained in the crystallizing b).

9. The process as claimed in claim 8, further comprising d) depositing a film of a transparent conductive oxide on the amorphous silicon film obtained in the depositing c).

10. The process as claimed in claim 9, further comprising e) depositing metallic contacts on the transparent conductive oxide film obtained in the depositing d).

11. The process as claimed in claim 1, wherein b) includes the baking at the second temperature of between 545° C. and 655° C. inclusive for a duration of between 400 minutes and 48 hours inclusive.

12. The process as claimed in claim 1, wherein b) includes the baking at the second temperature of between 595° C. and 605° C. inclusive for a duration of between 400 minutes and 1000 minutes.

13. The process as claimed in claim 1, wherein b) includes the baking at the second temperature of between 595° C. and 605° C. inclusive for a period of between 520 minutes and 540 minutes inclusive.

14. The process as claimed in claim 1, wherein the substrate is made of a support of borosilicate or of metal, and wherein the support is coated with a film of SiN or TiN that is formed by SiN or TiN deposition using EBPVD.

* * * * *